US009700930B2

(12) United States Patent
Yang

(10) Patent No.: US 9,700,930 B2
(45) Date of Patent: Jul. 11, 2017

(54) HEAT DISSIPATION DEVICE AND MANUFACTURING METHOD THEREOF

(71) Applicant: Asia Vital Components Co., Ltd., New Taipei (TW)

(72) Inventor: Hsiu-Wei Yang, New Tapei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 115 days.

(21) Appl. No.: 14/268,266

(22) Filed: May 2, 2014

(65) Prior Publication Data
US 2014/0237823 A1    Aug. 28, 2014

Related U.S. Application Data

(62) Division of application No. 13/280,364, filed on Oct. 25, 2011, now abandoned.

(51) Int. Cl.
| | |
|---|---|
| *B21D 53/02* | (2006.01) |
| *F28D 15/04* | (2006.01) |
| *H01L 23/40* | (2006.01) |
| *H01L 23/427* | (2006.01) |
| *H01L 23/367* | (2006.01) |

(52) U.S. Cl.
CPC ............. *B21D 53/02* (2013.01); *F28D 15/04* (2013.01); *H01L 23/4006* (2013.01); *H01L 23/427* (2013.01); *F28F 2275/20* (2013.01); *H01L 23/3672* (2013.01); *H01L 2924/0002* (2013.01); *Y10T 29/4935* (2015.01); *Y10T 29/49366* (2015.01)

(58) Field of Classification Search
CPC ... F28D 15/04; H05K 7/20336; H01L 23/427; H01L 23/4006; H01L 23/6372; B23P 15/26; B21D 53/02; B21D 53/06; Y10T 29/49353; Y10T 29/49393; Y10T 29/4935; Y10T 29/49366; F28F 2275/20
USPC ...................................... 165/104.33; 361/700
See application file for complete search history.

(56) References Cited

U.S. PATENT DOCUMENTS

| | | | | |
|---|---|---|---|---|
| 3,971,435 A | * | 7/1976 | Peck ....................... | B21D 53/02 122/366 |
| 4,461,343 A | * | 7/1984 | Token .................. | F28D 15/0233 165/104.26 |
| 4,638,854 A | * | 1/1987 | Noren ..................... | F28D 15/04 165/182 |

(Continued)

*Primary Examiner* — David Bryant
*Assistant Examiner* — Lawrence Averick
(74) *Attorney, Agent, or Firm* — C. G. Mersereau; Nikolai & Mersereau, P.A.

(57) ABSTRACT

A heat dissipation device and a manufacturing method thereof. The heat dissipation device includes a main body and at least one fixing hole. The main body has a first board body and a second board body corresponding to the first board body. The first and second board bodies are mated with each other to define a chamber. A working fluid and multiple support pillars are disposed in the chamber. At least one capillary structure is disposed on a surface of the chamber. The fixing hole is formed on the main body in a position where any support pillar is positioned. The fixing hole passes through the first and second board bodies and the support pillar. According to the above arrangement, the airtightness of the chamber of the main body can be ensured. Also, the heat spreader can be tightly connected with other components.

5 Claims, 16 Drawing Sheets

(56) References Cited

U.S. PATENT DOCUMENTS

| | | | | |
|---|---|---|---|---|
| 5,305,185 | A | * | 4/1994 | Samarov ............. H01L 23/4006 |
| | | | | 165/185 |
| 5,427,174 | A | * | 6/1995 | Lomolino, Sr. ...... F28D 15/0233 |
| | | | | 165/104.13 |
| 5,513,070 | A | * | 4/1996 | Xie ......................... G06F 1/203 |
| | | | | 165/185 |
| 6,302,192 | B1 | * | 10/2001 | Dussinger ........... F28D 15/0233 |
| | | | | 165/104.21 |
| 6,650,544 | B1 | * | 11/2003 | Lai ....................... F28D 15/046 |
| | | | | 165/104.21 |
| 6,802,363 | B1 | * | 10/2004 | Wang .................. F28D 15/0233 |
| | | | | 165/104.21 |
| 6,874,568 | B2 | | 4/2005 | Lai |
| 6,896,039 | B2 | | 5/2005 | Dussinger et al. |
| 7,066,240 | B2 | * | 6/2006 | Dussinger ........... F28D 15/0233 |
| | | | | 165/104.26 |
| 7,100,680 | B2 | * | 9/2006 | Dussinger ........... F28D 15/0233 |
| | | | | 165/104.21 |
| 8,985,196 | B2 | * | 3/2015 | Yang ................... F28D 15/0233 |
| | | | | 165/104.26 |
| 2002/0067598 | A1 | * | 6/2002 | Sathe .................. H01L 23/4006 |
| | | | | 361/700 |
| 2003/0155105 | A1 | * | 8/2003 | Garner ................ F28D 15/0233 |
| | | | | 165/104.26 |
| 2003/0159806 | A1 | | 8/2003 | Sehmbey et al. |
| 2005/0051307 | A1 | * | 3/2005 | Dussinger ........... F28D 15/0233 |
| | | | | 165/104.26 |
| 2006/0096740 | A1 | * | 5/2006 | Zheng ................. F28D 15/0233 |
| | | | | 165/104.26 |

\* cited by examiner

A-A Profile

HEAT DISSIPATION DEVICE AND MANUFACTURING METHOD THEREOF

CROSS-REFERENCE TO RELATED APPLICATIONS

The present application is a division of U.S. patent application Ser. No. 13/280,364, filed on Oct. 25, 2011, titled Heat Dissipation Device and Manufacturing Method Thereof, listing Hsiu-Wei Yang as inventor.

BACKGROUND OF THE INVENTION

1. Field of the Invention

The present invention relates generally to a heat dissipation device and a manufacturing method thereof, and more particularly to a fixing structure for a heat dissipation device. The fixing structure can be disposed on the heat dissipation device without damaging the main body thereof. Accordingly, the working fluid is prevented from leaking out of the chamber of the heat dissipation device so as not to affect heat transfer efficiency of the heat dissipation device.

2. Description of the Related Art

There is a trend to slim the electronic devices. To catch up this trend, the electronic components of the electronic devices must be miniaturized with the electronic devices. While reducing the size of the semiconductors that compose the electronic components, the electronic devices are still required to have advanced performance. In this case, it has become a critical topic how to efficiently dissipate heat generated by the electronic components.

A conventional heat spreader is used to face to face transfer heat by a large area. The heat spreader is different from a heat pipe that transfers heat point to point. The heat spreader is applicable to an electronic device with a narrower space.

The conventional heat spreader is connected to a substrate for transferring the heat generated by a heat generation component on the substrate. Conventionally, multiple through holes are formed in four corners of the heat spreader to avoid the chamber thereof. A copper pillar with an inner thread is fitted through each through hole. The substrate is formed with at least one perforation in a position where the copper pillar of the heat spreader is positioned. A fastening member is screwed through the copper pillar and the perforation to affix the heat spreader to the substrate. In such a fixing manner, the copper pillars are arranged in four corners of the heat spreader and spaced from the heat generation component by a considerably long distance. Therefore, after affixed to the substrate, the heat spreader can hardly tightly attach to the heat generation component. This will lead to thermal resistance. To overcome this problem, in another conventional heat spreader, the copper pillars are directly arranged in the heat spreader in a position near the heat generation component. In this case, the copper pillars directly pass through the chamber of the heat spreader to increase assembling tightness and avoid thermal resistance. However, after the copper pillars penetrate through the chamber of the heat spreader, the chamber is no more vacuumed and will lose its airtightness. Moreover, the copper pillars that pass through the chamber will interrupt the flowing path of the working fluid contained in the chamber and hinder the working fluid from smoothly flowing. This will deteriorate heat transfer efficiency or even cause leakage of the working fluid. Under such circumstance, the heat spreader will lose its heat transfer effect.

Please refer to FIGS. 1a and 1b. U.S. Pat. Nos. 7,066,240, 6,302,192 and 7,100,680 disclose a heat spreader structure 5 including a main body 51 composed of a first flat board 511 and a second flat board 512. An outer protrusion section 513 is formed along the periphery of each of the first and second flat boards 511, 512. The outer protrusion sections 513 are connected with each other to define a closed chamber 514. A recess 5111 is formed on the first flat board 511 and distal from the outer protrusion section 513 and connected to the second flat board 512. A perforation 52 passes through the recess 5111 of the first flat board 511 and the second flat board 512. The recess 5111 has an annular outer surface 5112 connected to a corresponding annular peripheral surface 5121 of the second flat board 512, whereby the perforation 52 is isolated from the main body 51. A spacer section 53 extends into contact between the first and second flat boards 511, 512. A capillary fiber structure 54 is disposed in the closed chamber 514. By means of the recess 5111, a support structure is provided for the heat spreader to achieve an airtight effect. However, due to the recess 5111, the internal room for vapor-liquid circulation of the working fluid in the chamber of the heat spreader is greatly minified. Also, due to the recess, the contact area between the heat spreader and the heat source is greatly reduced. This lowers the heat transfer efficiency.

According to the above, the conventional heat spreader has the following shortcomings:
1. The conventional heat spreader is likely to have the problem of thermal resistance.
2. The heat dissipation area of the conventional heat spreader is smaller.
3. The heat transfer efficiency of the conventional heat spreader is lowered.

SUMMARY OF THE INVENTION

A primary object of the present invention is to provide a heat dissipation device, which can increase assembling tightness to avoid thermal resistance.

A further object of the present invention is to provide a manufacturing method of a heat dissipation device, which can increase assembling tightness to avoid thermal resistance.

To achieve the above and other objects, the heat dissipation device of the present invention includes a main body and at least one fixing hole. The main body has a first board body and a second board body corresponding to the first board body. The first and second board bodies are mated with each other to define a chamber. The chamber has a first inner side and a second inner side. A working fluid and multiple support pillars are disposed in the chamber. At least one capillary structure is disposed on a surface of the chamber. Two ends of the support pillar are connected to the first and second sides of the chamber respectively. The fixing hole is formed on the main body in a position where any support pillar is positioned. The fixing hole passes through the first and second board bodies and the support pillar.

The manufacturing method of the heat dissipation device of the present invention includes steps of:
preparing a first board body and a second board body;
disposing at least one capillary structure and multiple support pillars on inner faces of the first and second board bodies;
mating the first and second board bodies with each other to form a heat dissipation device with a chamber, vacuuming the chamber, filling a working fluid into the chamber and sealing the heat dissipation device; and mechanically processing the first and second board bodies to form a fixing hole in a position where any support pillar is positioned.

According to the heat dissipation device and the manufacturing method thereof, the heat dissipation device can be more tightly attached to a heat source so as to avoid thermal resistance. Moreover, the fixing hole is formed on the main body without damaging the chamber of the main body. Therefore, the chamber is kept vacuumed and airtight to avoid leakage of working fluid. Accordingly, the present invention has the following advantages:
1. The heat dissipation device can be more tightly attached to a heat source so as to avoid thermal resistance.
2. The working fluid is prevented from leaking out of the chamber.
3. The lifetime of the heat dissipation device is longer.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
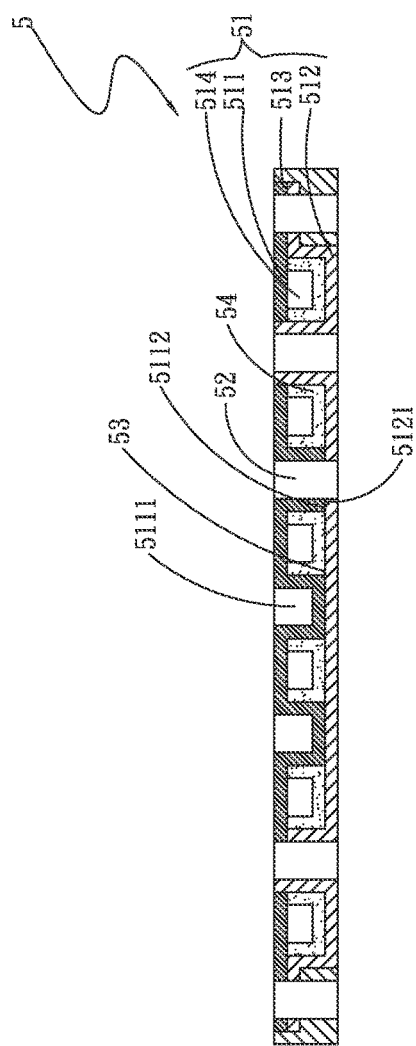
FIG. 1a is a sectional view of a conventional heat spreader.
Figure 1B:
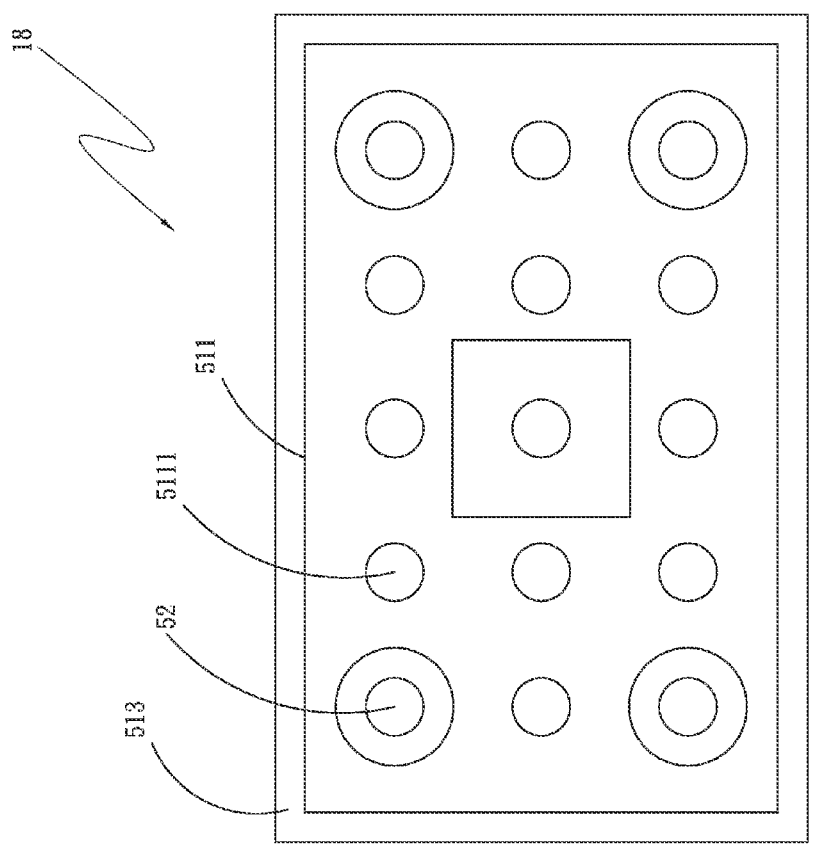
FIG. 1b is a top view of the conventional heat spreader.
Figure 2:
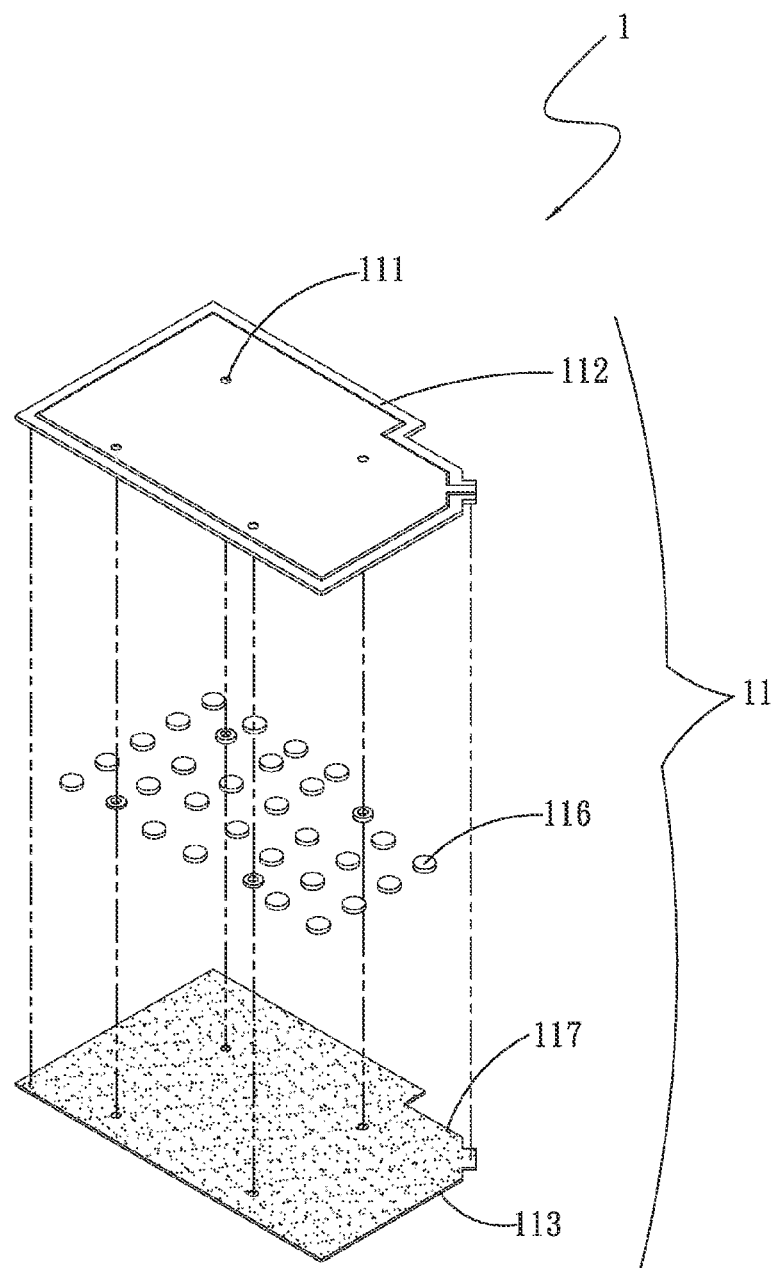
FIG. 2 is a perspective exploded view of a first embodiment of the heat dissipation device of the present invention.
Figure 3:
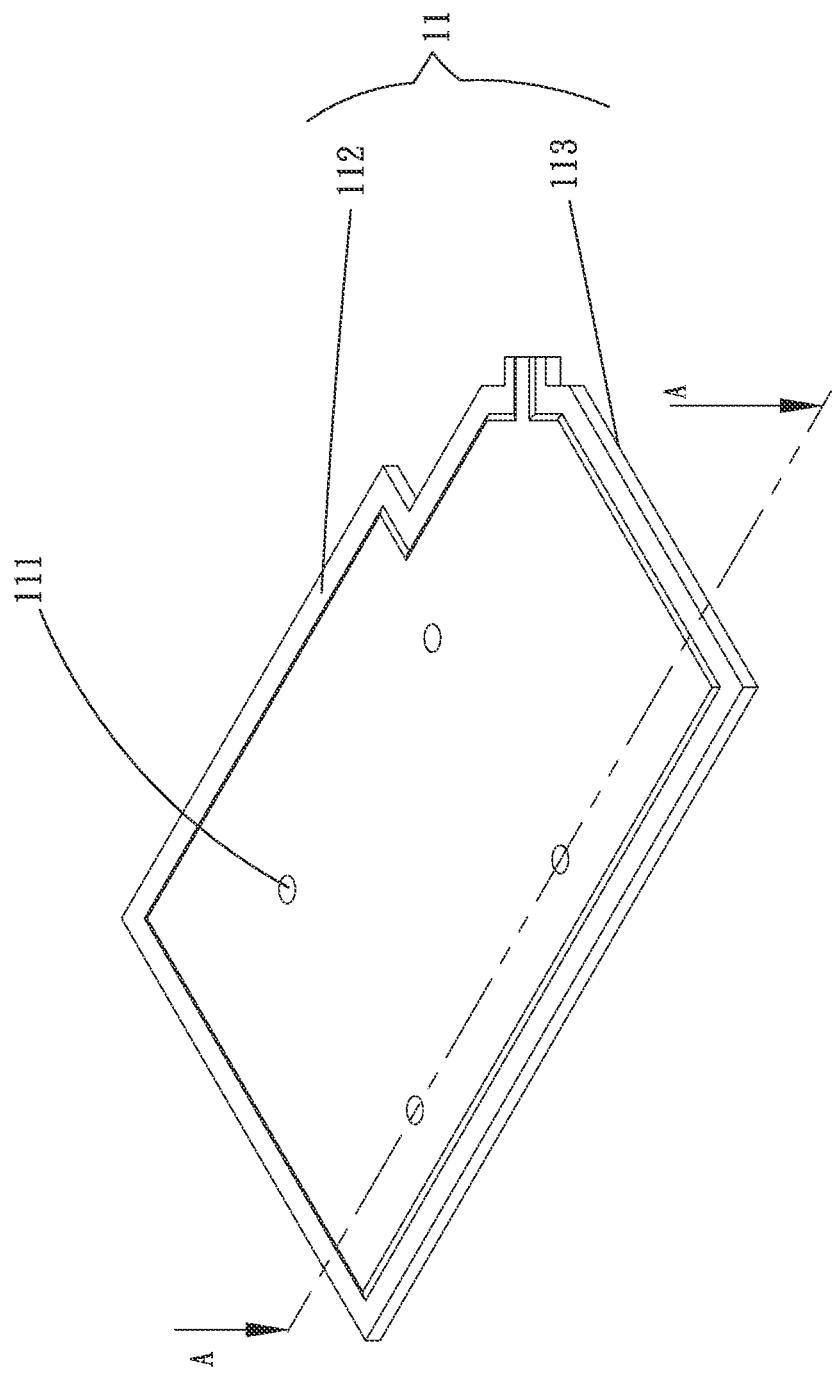
FIG. 3 is a perspective assembled view of the first embodiment of the heat dissipation device of the present invention.
Figure 4:
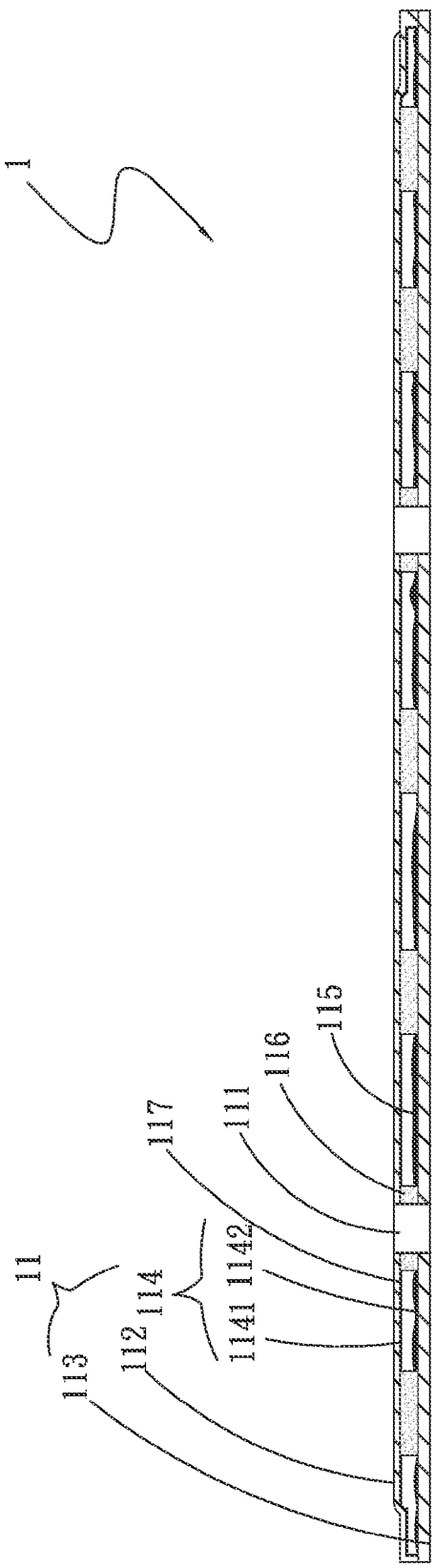
FIG. 4 is a sectional view taken along line A-A of FIG. 3.

Please refer to FIGS. 2, 3 and 4. FIG. 2 is a perspective exploded view of a first embodiment of the heat dissipation device of the present invention. FIG. 3 is a perspective assembled view of the first embodiment of the heat dissipation device of the present invention. FIG. 4 is a sectional view taken along line A-A of FIG. 3. According to the first embodiment, the heat dissipation device 1 of the present invention includes a main body 11 and at least one fixing hole 111.

The main body 11 has a first board body 112 and a second board body 113 corresponding to the first board body 112. The first and second board bodies 112, 113 are mated with each other to define a chamber 114. The chamber 114 has a first inner side 1141 and a second inner side 1142. A working fluid 115 and multiple support pillars 116 are disposed in the chamber 114. At least one capillary structure 117 is disposed on a surface of the chamber 114. Two ends of the support pillar 116 are connected to the first and second sides 1141, 1142 of the chamber 114 respectively. The capillary structure 117 is a sintered powder body.

The fixing hole 111 is formed on the main body 11 in a position where any support pillar 116 is positioned. The fixing hole 111 passes through the first and second board bodies 112, 113 and the support pillar 116.

In this embodiment, the heat dissipation device 1 is, but not limited to, a heat spreader for illustration purposes only.

Figure 5:
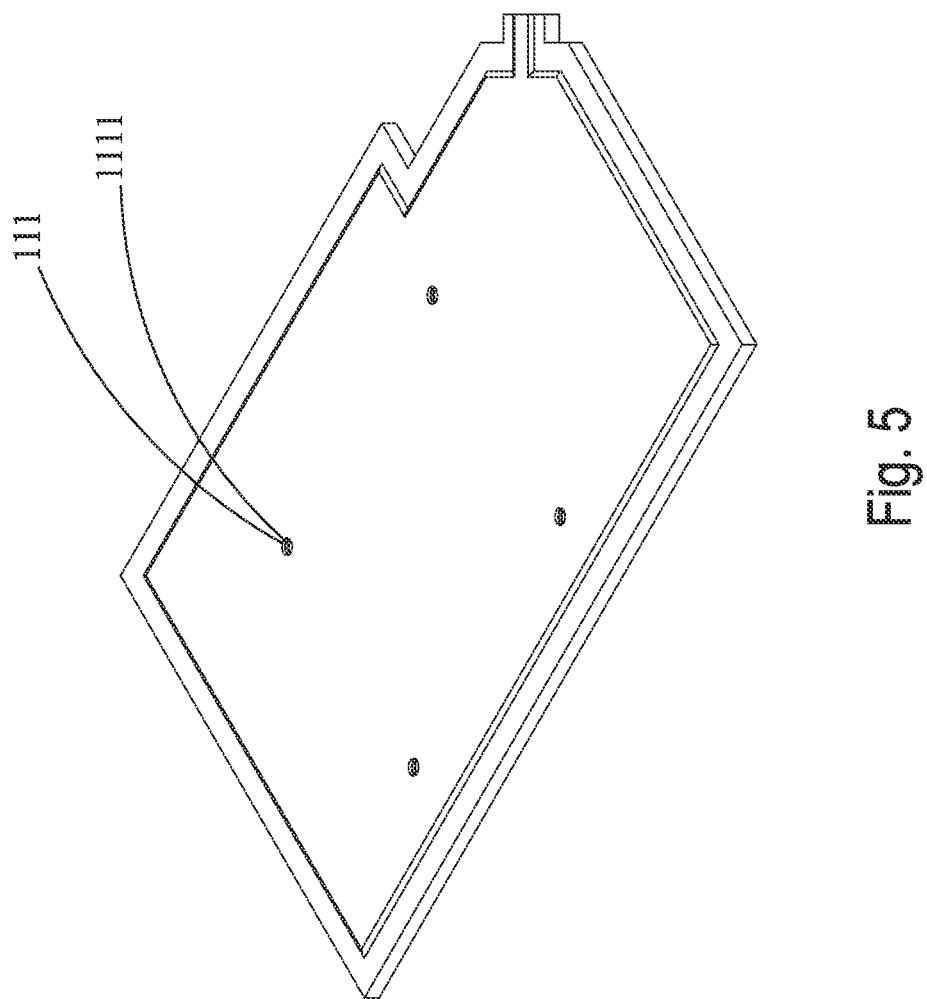
FIG. 5 is a perspective view of a second embodiment of the heat dissipation device of the present invention.

Please refer to FIG. 5, which is a perspective view of a second embodiment of the heat dissipation device of the present invention. The second embodiment is partially identical to the first embodiment in structure and thus will not be repeatedly described hereinafter. The second embodiment is different from the first embodiment in that the fixing hole 111 is formed with an inner thread 1111.

Figure 6:
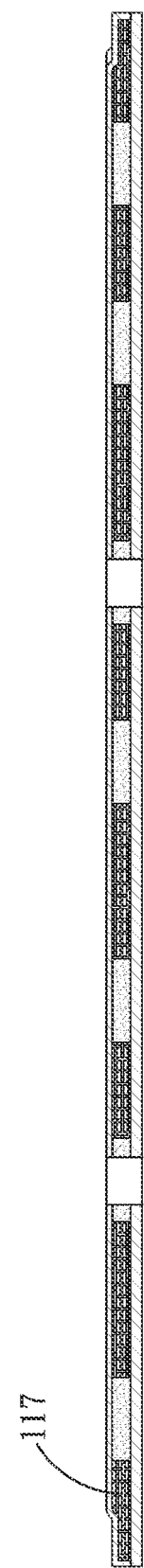
FIG. 6 is a sectional view of a third embodiment of the heat dissipation device of the present invention.

Please refer to FIG. 6, which is a sectional view of a third embodiment of the heat dissipation device of the present invention. The third embodiment is partially identical to the first embodiment in structure and thus will not be repeatedly described hereinafter. The third embodiment is different from the first embodiment in that the capillary structure 117 is a mesh body.

Figure 7:
FIG. 7 is a sectional view of a fourth embodiment of the heat dissipation device of the present invention.

Please refer to FIG. 7, which is a sectional view of a fourth embodiment of the heat dissipation device of the present invention. The fourth embodiment is partially identical to the first embodiment in structure and thus will not be repeatedly described hereinafter. The fourth embodiment is different from the first embodiment in that the capillary structure 117 is a channeled structure.

Figure 8:
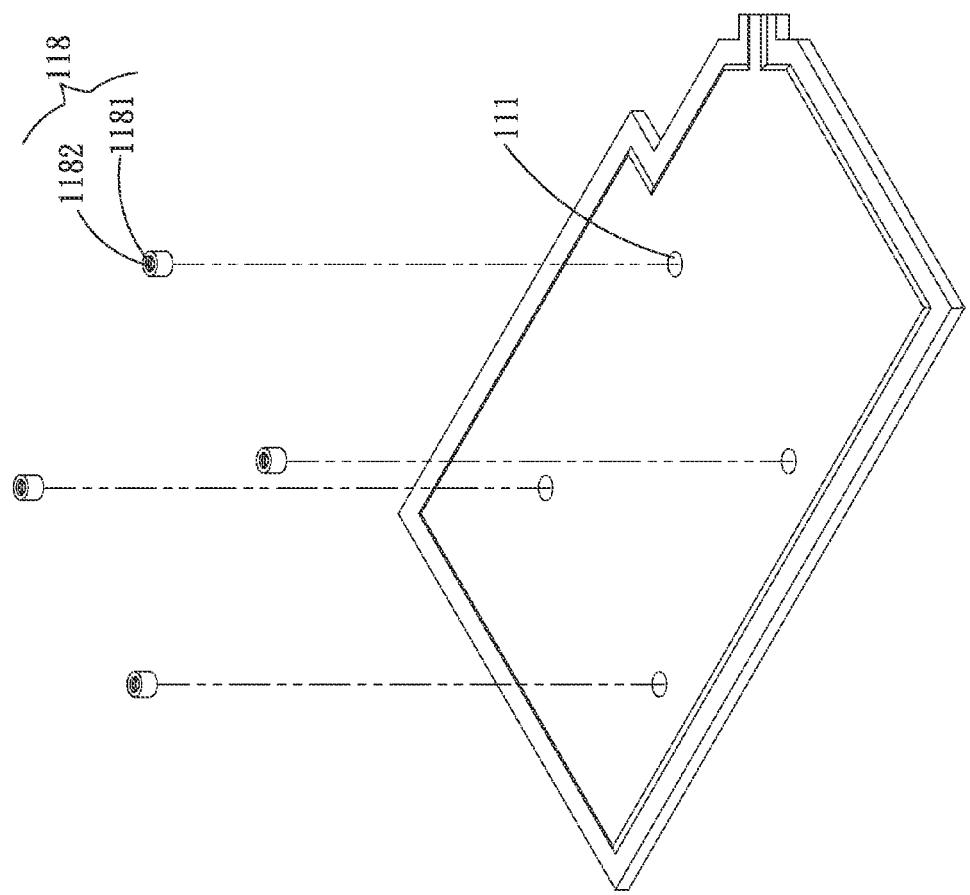
FIG. 8 is a perspective view of a fifth embodiment of the heat dissipation device of the present invention.

Please refer to FIG. 8, which is a perspective view of a fifth embodiment of the heat dissipation device of the present invention. The fifth embodiment is partially identical to the first embodiment in structure and thus will not be repeatedly described hereinafter. The fifth embodiment is different from the first embodiment in that the fifth embodiment of the heat dissipation device 1 further has a fixing member 118. One end of the fixing member 118 is correspondingly fitted through the fixing hole 111. The fixing member 118 has a hole 1181 formed with an inner thread 1182.

Figure 9:
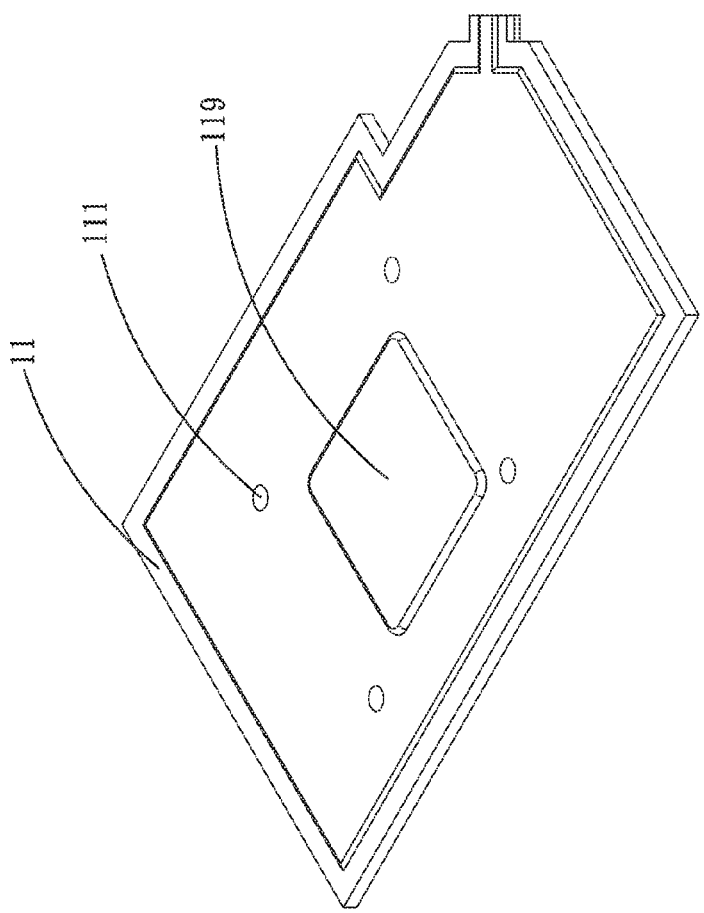
FIG. 9 is a perspective view of a sixth embodiment of the heat dissipation device of the present invention.

Please refer to FIG. 9, which is a perspective view of a sixth embodiment of the heat dissipation device of the present invention. The sixth embodiment is partially identical to the first embodiment in structure and thus will not be repeatedly described hereinafter. The sixth embodiment is different from the first embodiment in that at least one raised heated section 119 is disposed on an outer side of the main body 11 in adjacency to the fixing hole 111.

Figure 10:
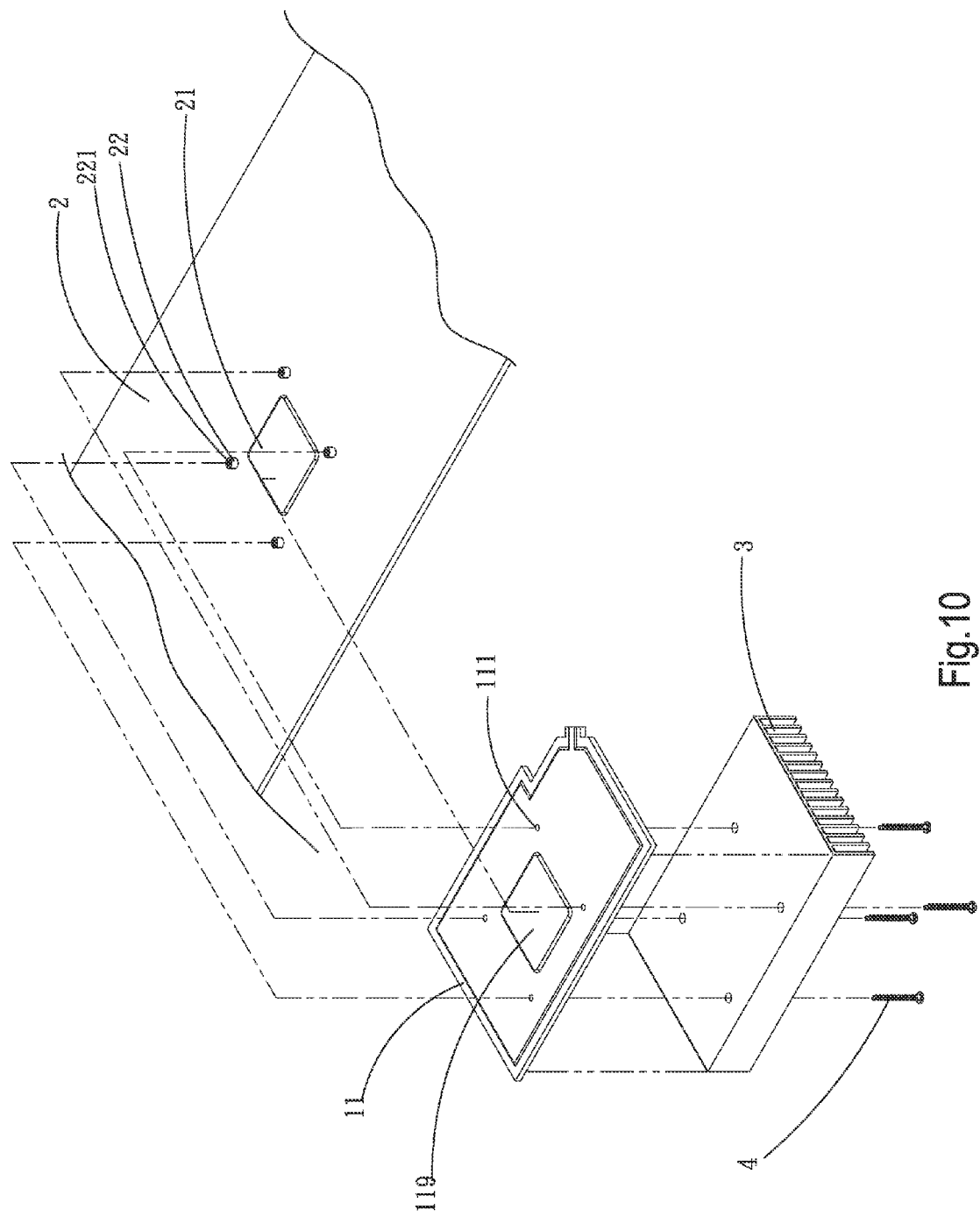
FIG. 10 is a perspective exploded view of a seventh embodiment of the heat dissipation device of the present invention.
Figure 11:
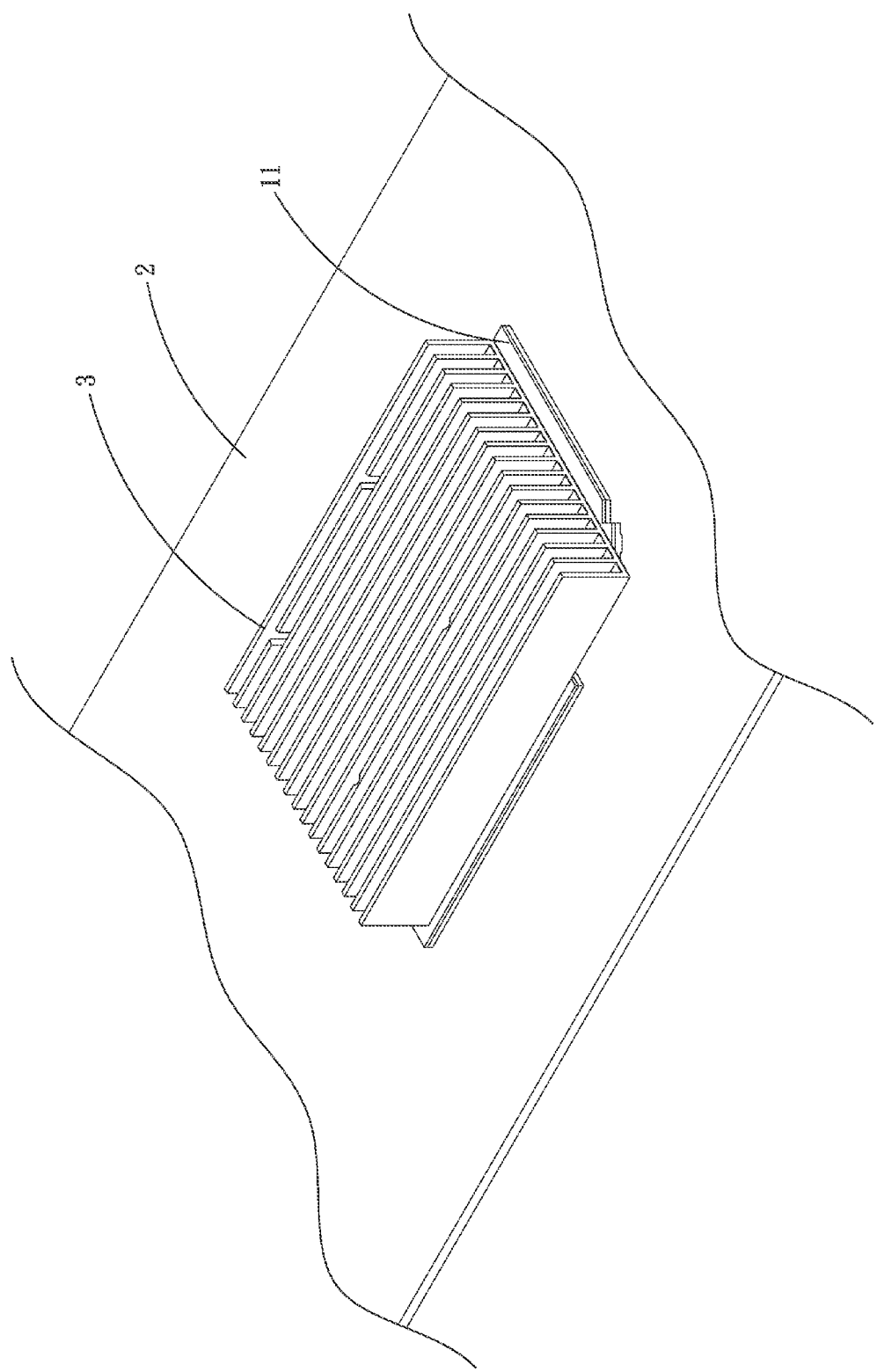
FIG. 11 is a perspective assembled view of the seventh embodiment of the heat dissipation device of the present invention.

Please refer to FIGS. 10 and 11. FIG. 10 is a perspective exploded view of a seventh embodiment of the heat dissipation device of the present invention. FIG. 11 is a perspective assembled view of the seventh embodiment of the heat dissipation device of the present invention. The seventh embodiment is partially identical to the first embodiment in structure and thus will not be repeatedly described hereinafter. The seventh embodiment is different from the first embodiment in that the main body 11 is correspondingly attached to a substrate 2. At least one raised heated section 119 is disposed on one side of the main body 11. A heat sink 3 is connected to the other side of the main body 11 opposite to the heated section 119. The heated section 119 of the main body 11 contacts at least one heat source 21 on the substrate 2. Multiple fixing bosses 22 are arranged along a periphery of the heat source 21 of the substrate 2. Each fixing boss 22 has an inner thread 221 corresponding to the fixing hole 111. A fastening member 4 is passed through the fixing hole 111 and the inner thread 221 of the fixing boss 22 to affix the main body 11 onto the substrate 2.

Figure 12:
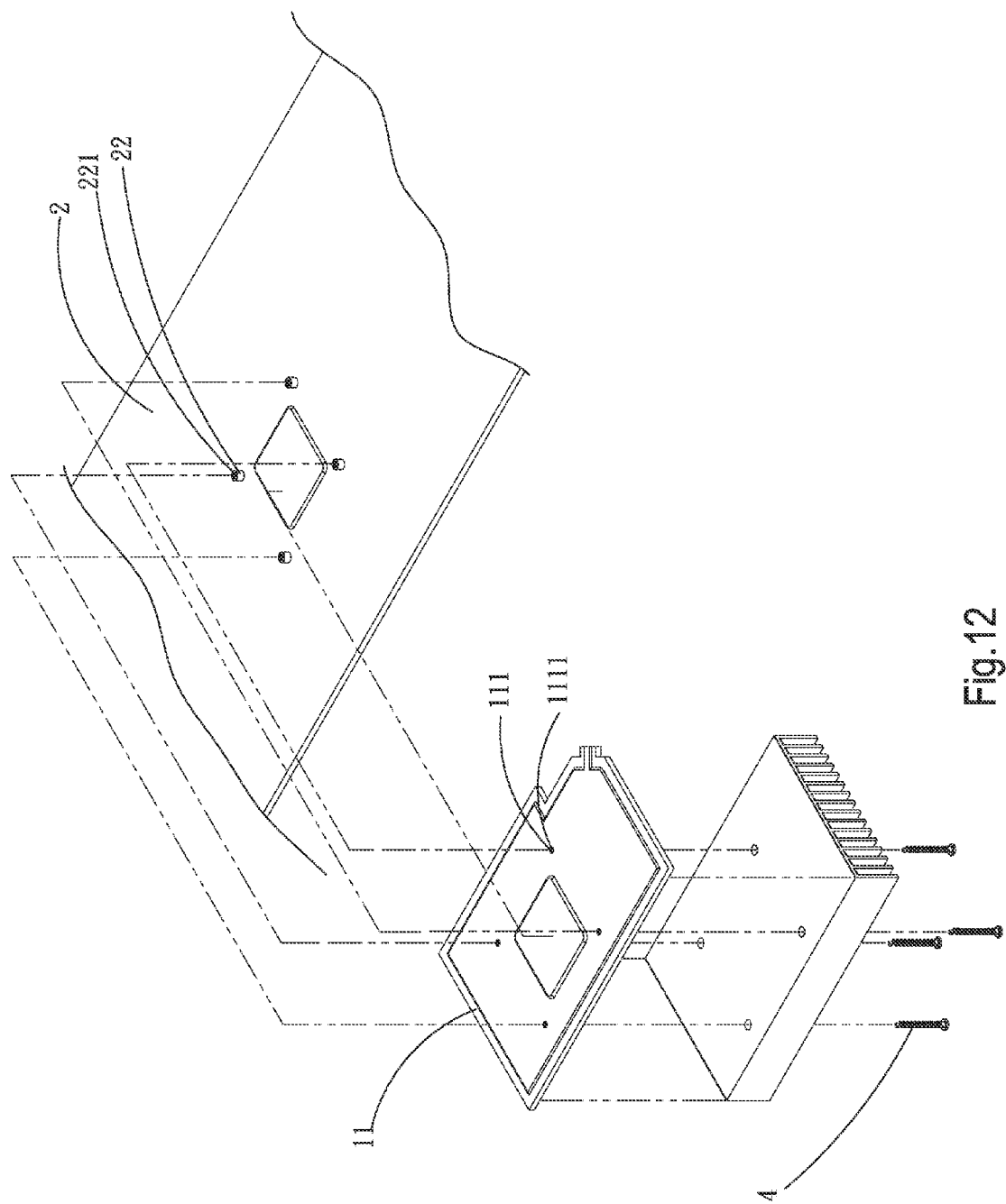
FIG. 12 is a perspective exploded view of an eighth embodiment of the heat dissipation device of the present invention.

Please refer to FIG. 12, which is a perspective exploded view of an eighth embodiment of the heat dissipation device of the present invention. The eighth embodiment is partially identical to the seventh embodiment in structure and thus will not be repeatedly described hereinafter. The eighth embodiment is different from the seventh embodiment in that the fixing hole 111 has an inner thread 1111. The fastening member 4 is passed through the inner thread 1111 of the fixing hole 111 and the inner thread 221 of the fixing boss 22 to affix the main body 11 onto the substrate 2.

Figure 13:
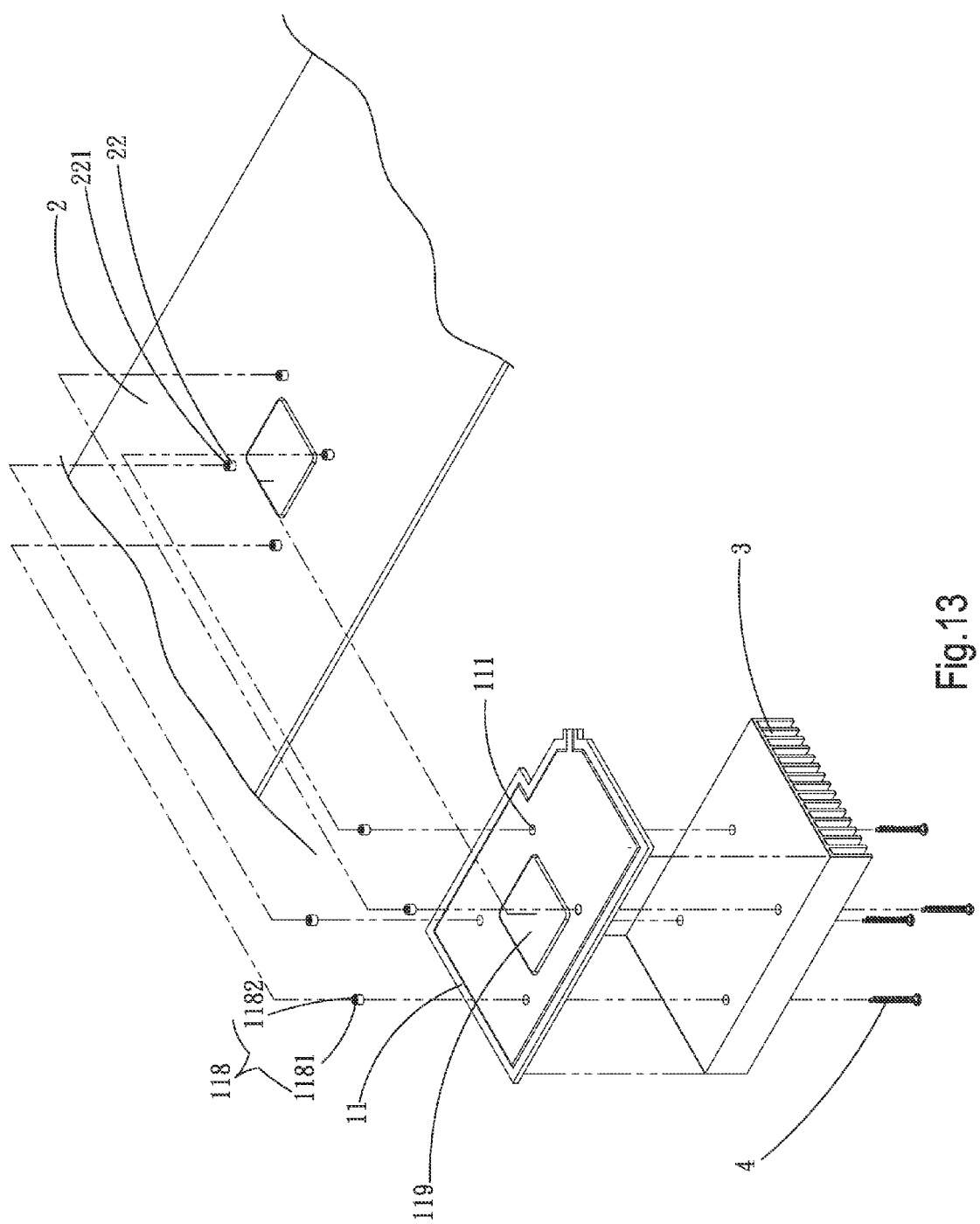
FIG. 13 is a perspective exploded view of a ninth embodiment of the heat dissipation device of the present invention.
Figure 14:
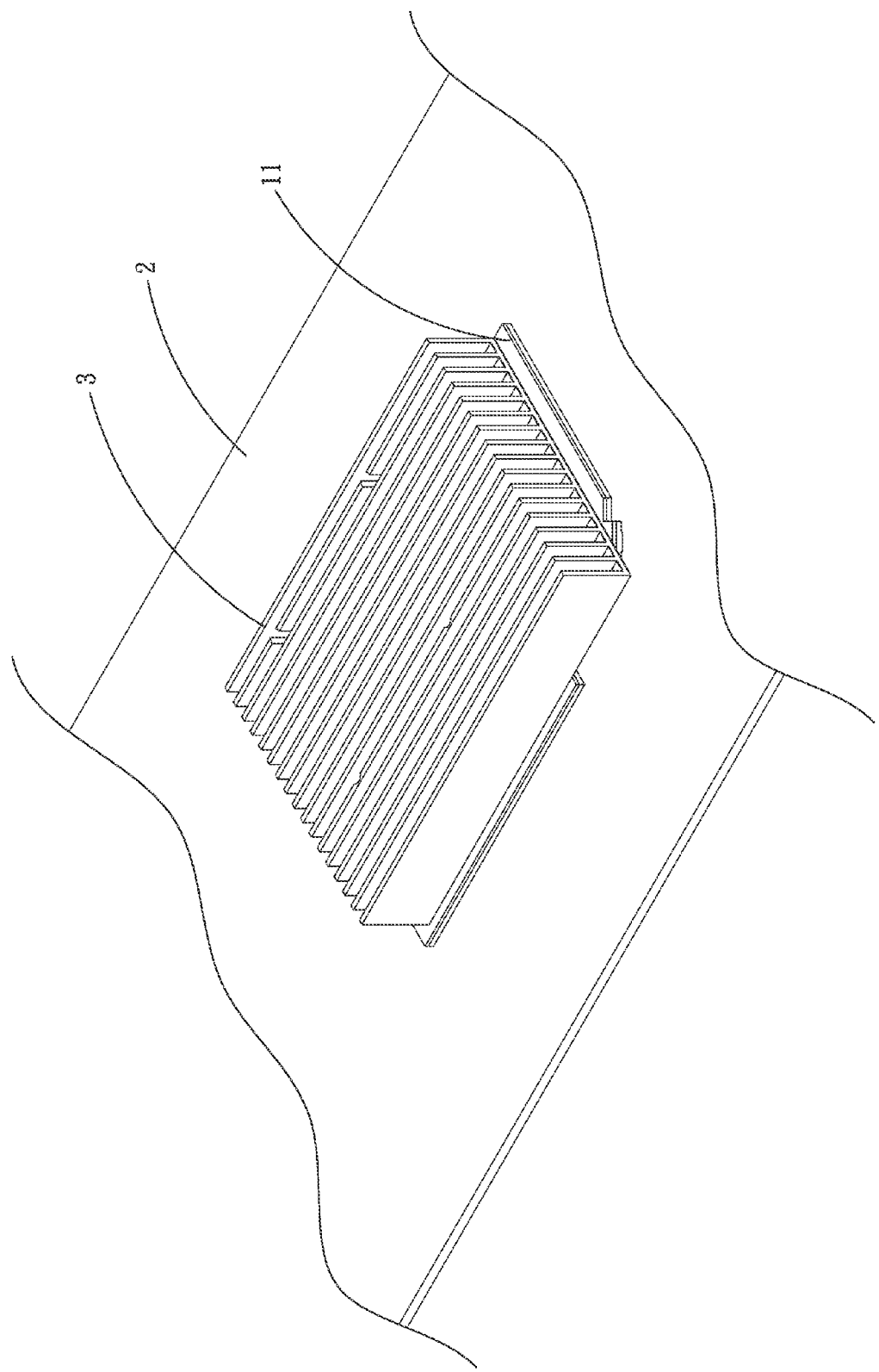
FIG. 14 is a perspective assembled view of the ninth embodiment of the heat dissipation device of the present invention.

Please refer to FIGS. 13 and 14. FIG. 13 is a perspective exploded view of a ninth embodiment of the heat dissipation device of the present invention. FIG. 14 is a perspective assembled view of the ninth embodiment of the heat dissipation device of the present invention. The ninth embodiment is partially identical to the seventh embodiment in structure and thus will not be repeatedly described hereinafter. The ninth embodiment is different from the seventh embodiment in that the ninth embodiment of the heat dissipation device 1 further has a fixing member 118. One end of the fixing member 118 is correspondingly fitted through the fixing hole 111 of the main body 11. The fixing member 118 has a hole 1181 formed with an inner thread 1182. The fastening member 4 is passed through the inner thread 1182 of the hole 1181 and the inner thread 221 of the fixing boss 22 to affix the main body 11 onto the substrate 2.

Figure 15:
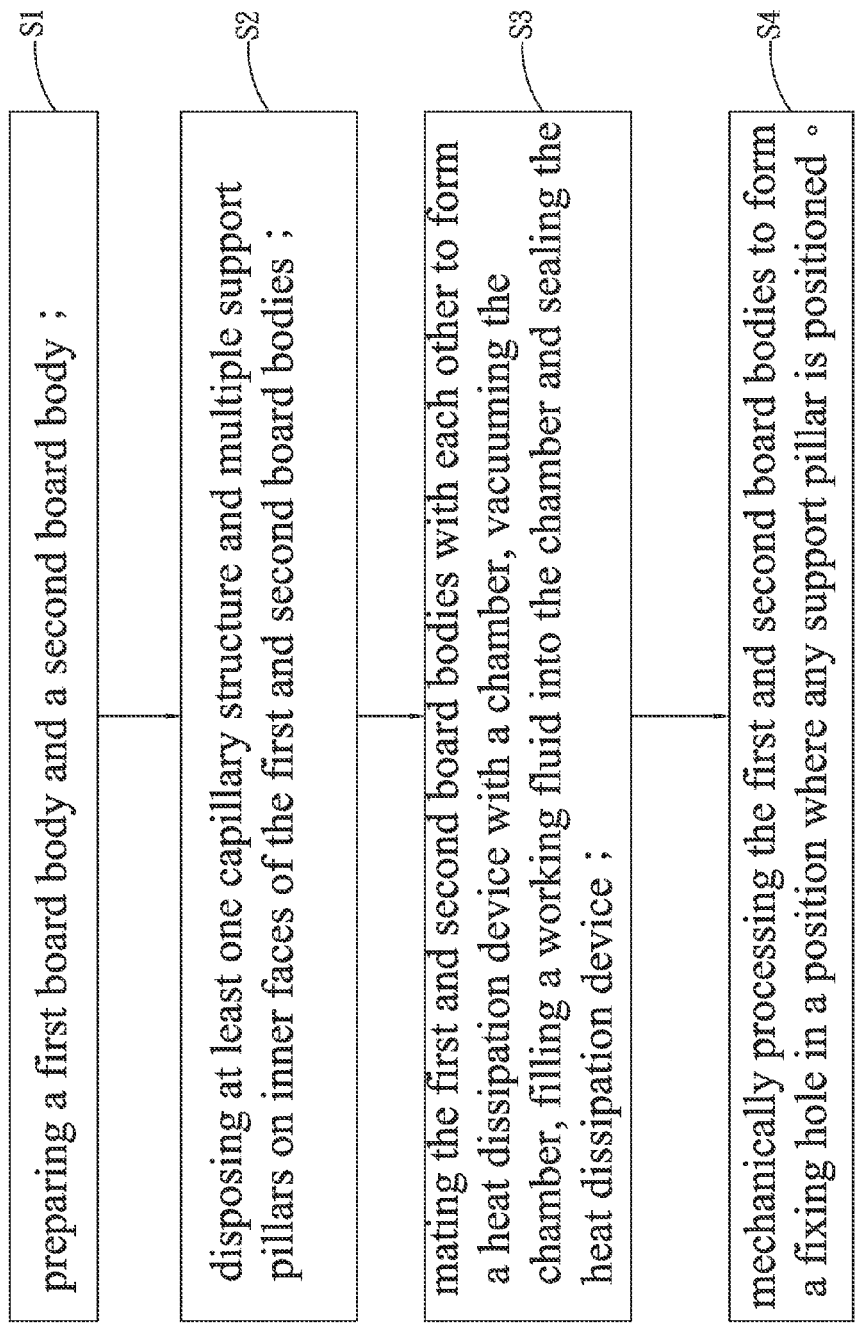
FIG. 15 is a flow chart of the manufacturing method of the heat dissipation device of the present invention.

Please refer to FIG. 15, which is a flow chart of the manufacturing method of the heat dissipation device of the present invention. Also referring to FIGS. 2 to 9, the manufacturing method of the heat dissipation device of the present invention includes steps of:

S1: preparing a first board body and a second board body, a first board body 112 and a second board body 113 being prepared, the first and second board bodies 112, 113 being made of a material with good heat conductivity, such as copper material, aluminum material, stainless steel or ceramic material, in this embodiment, the material being, but not limited to, copper material for illustration purposes only;

S2: disposing at least one capillary structure and multiple support pillars on inner faces of the first and second board bodies, at least one layer of capillary structure 117 and multiple support pillars 116 being disposed on inner faces of the first and second board bodies 112, 113, which inner faces are to be mated with each other, the capillary structure 117 being selected from a group consisting of sintered powder body (as shown in FIG. 4), mesh body (as shown in FIG. 6) and channeled structure (as shown in FIG. 7), the support pillars 116 being selected from a group consisting of copper pillars and aluminum pillars, the capillary structure 117 and the support pillars 116 being connected with the first and second board bodies 112, 113 by means of a process selected from a group consisting of diffusion bonding, sintering and brazing;

S3: mating the first and second board bodies with each other to form a heat dissipation device with a chamber, vacuuming the chamber, filling a working fluid into the chamber and sealing the heat dissipation device, the first and second board bodies 112, 113 being mated and fixedly connected with each other by means of diffusion bonding or brazing to form a heat dissipation device 1 with a chamber 114, the chamber 114 being vacuumed and a working fluid 115 being filled into the chamber 114 and then the heat dissipation device 1 being sealed; and S4: mechanically processing the first and second board bodies to form a fixing hole in a position where any support pillar is positioned, after sealed, the heat dissipation device 1 being mechanically processed to form a fixing hole 111, the fixing hole 111 being arranged in adjacency to a section of the heat dissipation device 1 for attaching to a heat source and conducting heat generated by the heat source, the fixing hole 111 being formed on the heat dissipation device 1 in a position where the support pillar 116 is positioned in the chamber 114 of the heat dissipation device 1, the fixing hole 111 passing through the main body 11 of the heat dissipation device 1 and the support pillar 116.

The mechanical processing is selected from a group consisting of punching, drilling and milling. In this embodiment, the mechanical processing is, but not limited to, punching for illustration purposes only.

The above embodiments are only used to illustrate the present invention, not intended to limit the scope thereof. It is understood that many changes and modifications of the above embodiments can be made without departing from the spirit of the present invention. The scope of the present invention is limited only by the appended claims.

What is claimed is:

1. A manufacturing method of a heat dissipation device, comprising steps of:
   preparing a first board body and a second board body, wherein a planar raised section is selectively disposed on an outer surface of the first board body or the second board body for directly contacting a flat surface of a heat source;
   disposing at least one capillary structure on and multiple support pillars extending between inner faces of the first and second board bodies;
   mating the first and second board bodies with each other to form a heat dissipation device with a closed chamber, the support pillars being disposed in the closed chamber, vacuuming the closed chamber, filling a working fluid into the closed chamber and sealing the heat dissipation device, wherein two ends of each of the support pillar are respectively connected with the capillary structure on the inner faces of the first and second board bodies; and
   mechanically processing the first and second board bodies to form a fixing hole through the closed chamber in the first and second board bodies and a corresponding support pillar in a position where a selected support pillar is positioned.

2. The manufacturing method of the heat dissipation device as claimed in claim 1, wherein the capillary structure is selected from a group consisting of sintered powder body, and channeled structure.

3. The manufacturing method of the heat dissipation device as claimed in claim 1, wherein the heat dissipation device further has a fixing member, one end of the fixing member being correspondingly fitted through the fixing hole, the fixing member having a hole formed with an inner thread.

4. The manufacturing method of the heat dissipation device as claimed in claim 1, wherein the mechanical processing is selected from a group consisting of punching, drilling and milling.

5. The manufacturing method of the heat dissipation device as claimed in claim 1, wherein the capillary structure and the support pillars are connected with the first and second board bodies by means of a process selected from a group consisting of diffusion bonding, sintering and brazing.

\* \* \* \* \*